United States Patent [19]

Teckman

[11] Patent Number: 5,633,631
[45] Date of Patent: May 27, 1997

[54] BINARY-TO-TERNARY ENCODER

[75] Inventor: Timothy A. Teckman, Aloha, Oreg.

[73] Assignee: Intel Corporation, Santa Clara, Calif.

[21] Appl. No.: 266,149

[22] Filed: Jun. 27, 1994

[51] Int. Cl.$^6$ .............................. H03M 5/16; H03K 17/00
[52] U.S. Cl. .................................................. 341/58; 341/57
[58] Field of Search .................................. 341/57, 58, 95, 341/106, 59

[56] References Cited

U.S. PATENT DOCUMENTS 5,525,983  6/1996  Patel et al. .................................. 341/57

OTHER PUBLICATIONS

"MAC Parameters, Physical Layer, Medium Attachment Units and Repeater for 100 Mb/s Operation (Clause XX)" Feb. 9, 1994, Draft Supplement to IEEE Std. 802.3, pp. 1–69.

*Primary Examiner*—Jeffrey A. Gaffin
*Assistant Examiner*—Peguy Jean Pierre
*Attorney, Agent, or Firm*—Blakely, Sokoloff, Taylor & Zafman

[57] ABSTRACT

A method for encoding binary data for transmission over a serial link as a ternary code. Binary data is received and mapped into a binary code. The binary code is translated into a ternary code, and the ternary code is transmitted over the serial link. The ternary code is selectively inverted according to a predetermined protocol such that the serial link maintains a time-averaged zero DC balance.

38 Claims, 10 Drawing Sheets

BINARY-TO-TERNARY ENCODER

BACKGROUND OF THE INVENTION

1. Field of the Invention

The present invention relates generally to the encoding of data for transmission over a serial link and more particularly to the binary-to-ternary encoding and decoding of data transmitted over twisted-pair wire.

2. Art Background

Prior art local area networks (LANs) such as Ethernet™ typically utilize serial links for the transmission of binary data between nodes. Typical examples of prior art serial links are coaxial cable and twisted-pair wire. Transmission of digital data over the serial link is accomplished by varying the analog voltage levels of the serial link. One concern of transmitting data over such serial links is maintaining the reliable determination of transmitted data in view of the capacitance of the serial link itself. Because the conductor of the serial link acts as a capacitor, care must be taken to ensure that no charge is stored in the serial link. If the serial link is allowed to store charge, the transmitted data may be incorrectly sensed.

A typical prior art method for ensuring that there is no charge stored in the serial link of the LAN is Manchester encoding. Manchester encoding ensures that in any given packet or frame of transmitted data, the number of logic O's transmitted and the number of logic 1's transmitted are equal. This equality is termed "zero-balanced." Zero-balanced coding schemes ensure that the net charge, or direct current (DC) balance of the serial link is zero.

One limitation of Manchester encoding schemes is that Manchester encoding requires a doubling of the bandwidth for the serial link. When the desired bandwidth of the LAN is very high, e.g. 100 MBp/s, and the serial link is twisted-pair, Manchester encoding cannot be supported. This is because twisted-pair cannot support a bandwidth of 200 MBp/s over a significant distance, e.g. 100 meters. Therefore, Manchester encoding cannot be used in all situations. However, Manchester encoding has attributes that are important to reliably transmit data over serial links. Specifically, it is desirable that the DC balance of the serial link be maintained at zero. Therefore, a new encoding system for transmitting zero DC balanced data over a high bandwidth LAN is required.

SUMMARY AND OBJECTS OF THE INVENTION

One object of the present invention is to provide for the time-averaged zero DC-balance of the serial link.

Another object of the present invention is to provide a binary-to-ternary encoder that encodes binary data as ternary data for transmission over a serial link.

Another object of the present invention is to provide a ternary-to-binary decoder for decoding ternary data received from a serial link.

These and other objects of the invention are provided for by a method for encoding binary data for transmission over a serial link as a ternary code. Binary data is received and mapped into a binary code. The binary code is translated into a ternary code, and the ternary code is transmitted over the serial link. The ternary code is selectively inverted according to a predetermined protocol such that the serial link maintains a time-averaged zero DC balance.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The following description provides numerous specific details and examples. Further, the figures that accompany the description contain further details that are intended to assist the reader in better understanding the features, advantages and construction of the present invention. These details and examples are provided for illustrative purposes only, and should not be regarded as exhaustive of the ways in which the teachings of the present disclosure may be modified or applied.

The method and apparatus for encoding and decoding binary data to ternary data as described herein are of particular use in high-speed Ethernet™ local area networks that operate at 100 MBp/s a standard for which is currently under development by the Institute of Electrical and Electronics Engineers (IEEE). The developing standard supplements the ANSI/IEEE 802.3 standard. The current designation for the supplement is "100 BASE-4T."

Figure 1:
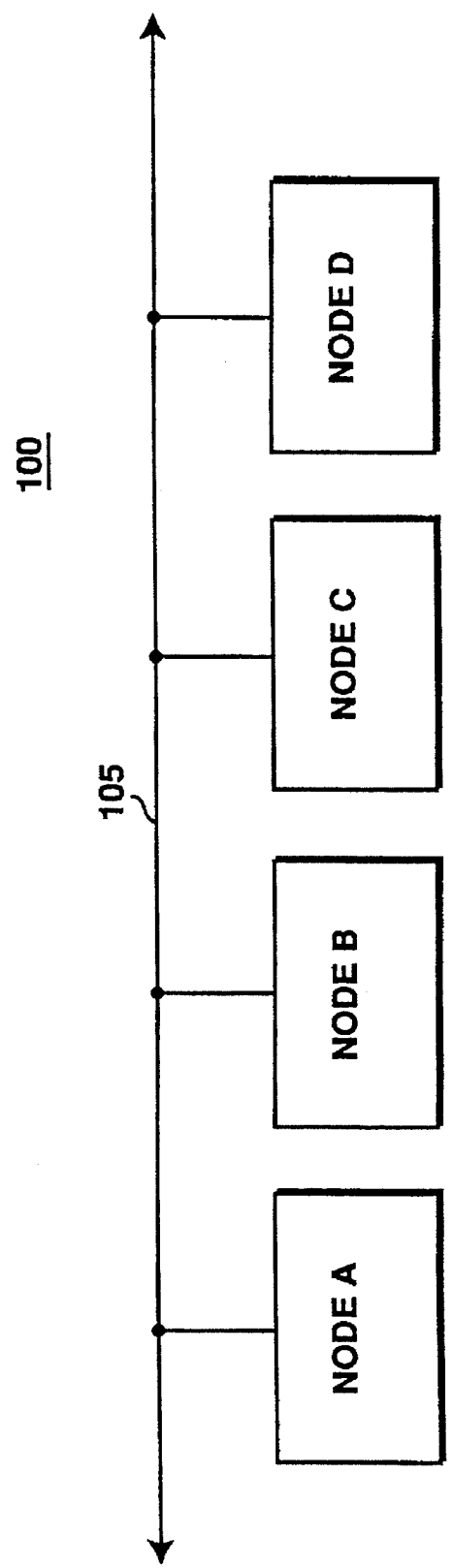
FIG. 1 shows a computer network according to one embodiment.

FIG. 1 shows a computer network 100 according to a first embodiment. Serial link 105 is coupled to nodes A, B, C and D, for the transmission of data between each of the nodes. In this embodiment, the serial link 105 is preferably twisted-pair wire, although it may be coaxial cable or any equivalent conductor. The computer network 100 is designed to transmit ternary, or tri-level data over the serial link 105. The nodes A, B, C and D are preferably designed to operate using standard binary data. Thus, each of the nodes A, B, C and D include encoders and decoders for interfacing with and transmitting data over the serial link 105.

Figure 2:
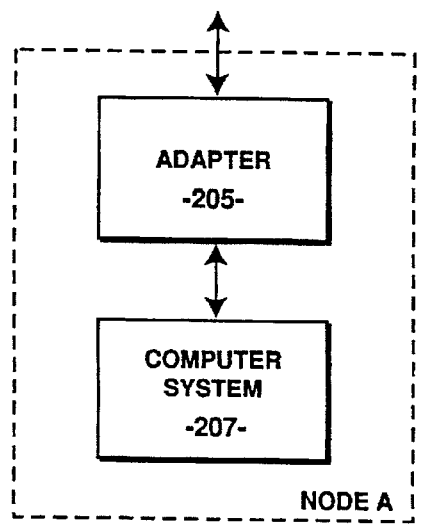
FIG. 2 shows a single node of a computer network according to one embodiment.

FIG. 2 shows node A in further detail. FIG. 2 is illustrative of each of the nodes connected to serial link 105. In essential terms, node A includes an adapter 205 and a computer system 207. The adapter 205 is coupled both to the serial link 105 and to the computer system 207. The adapter 205 contains circuitry necessary to encode data received from the computer system 207 and to transmit the encoded data over the serial link 105. The adapter 205 also contains circuitry necessary to receive encoded data from the serial link 105 and to decode the encoded data. For example, the adapter 205 may be a media access controller (MAC)

constructed according to one of the various 802 LAN standards promulgated by the Institute of Electrical and Electronic Engineers (IEEE).

In addition to encoding data from the binary representation of the computer system 207 to the ternary representation of the serial link 105, the adapter 205 must also be capable of translating data from a parallel form to a serial form. This is typically true when the adapter is coupled to the system bus of the computer system 207, which typically operates through the parallel transmission of data. The computer system 207 may be, for example, a personal computer having a CPU, main memory and a display device. The adapter 205 may be physically incorporated in the computer system 207 as an adapter board coupled to a slot in the bus for the computer system 207.

Figure 3:
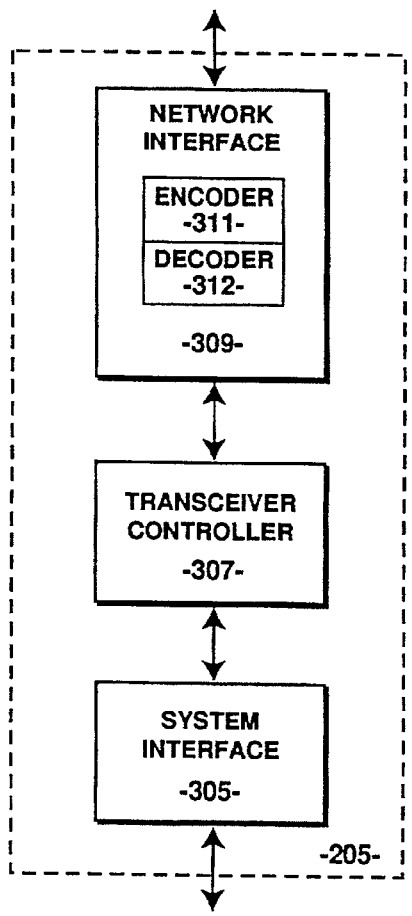
FIG. 3 shows an adapter of a computer network node according to one embodiment.

FIG. 3 shows the adapter 205 for node A in greater detail. The adapter 205 includes a system interface 305 for receiving data from the computer system 207 and for receiving data from the transceiver controller 307. The transceiver controller 307 is typically responsible for the managing incoming and outgoing data for node A. The network interface 309 is for interfacing with the serial link 105. The circuitry of the present invention, as described below, may be disposed within any one of these functional units. Typically, however, the circuitry of the present embodiments is disposed within the network interface block 309. Thus, network interface 309 is shown as including binary-to-ternary encoder 311 and ternary-to-binary decoder 312.

As described above, the serial link 105 operates using tri-level encoding. This means that data is transmitted over the serial link 105 by varying the voltage level of the serial link 105 to be one of three possible analog voltages. The largest of the three analog voltage levels preferably corresponds to a ternary logic +1, the intermediate analog voltage level preferably corresponds to a ternary logic 0, and the smallest analog voltage level preferably corresponds to a ternary logic −1. The preferred analog voltage levels of the present embodiment are 3.5 volts for ternary logic +1, 0.0 volts for ternary logic 0, and −3.5 volts for ternary logic −1. Using ternary analog voltage levels for transmitting data over the serial link 105 allows for a time average zero-balance for the transmission of data without a corresponding increase in bandwidth requirements for the serial link 105. Tri-level encoding also results in an overall compression of the original binary data. For example, only six ternary bits are required to express eight binary bits.

According to the present embodiment, the adapter 205 encodes eight binary bits of data received from the computer system 207 into six ternary bits of data for transmission over the serial link 105. The amount of data to be encoded may be varied according to the protocols and transmission requirements of the network in which the encoder is implemented. The present embodiment contemplates the serial-to-parallel conversion of the data taking place within the encoder. Alternatively, parallel-to-serial conversion may occur prior to data being received from the computer system 207. For the purposes of illustration, a binary-to-ternary encoder 311 is shown as being disposed within the network interface 309.

For LANs, data transmission over the serial link typically occurs in a packet-switched manner. For example, in Ethernet™ a transmitting node transmits a packet or frame of data having at least sixty-four binary bytes of data. Manchester encoding ensures that a zero DC balance is maintained for the serial link between transmission of frames of binary data. A goal of the present embodiment is to similarly maintain a time-averaged zero DC balance for the serial link without using Manchester encoding.

For the present encoding scheme, every eight binary bits to be encoded as ternary data are first mapped to a binary code having twelve binary bits. There are a total of 256 binary codes, one binary code for each possible combination of eight binary bits of data. Each binary code is divided into six groups of two binary bits, and each of the six groups of two binary bits are translated into a ternary symbol according to the simple binary-to-ternary translations of Table 1 such that a six ternary symbol code results. The six ternary symbol code is then transmitted over the serial link 105.

Table 1 shows one of thirty possible complete, non-unique translations between two binary bits and one ternary symbol. Wherein alternative translations may be utilized, the specific translations shown are chosen to further the goal of providing a time-averaged zero DC balance. Specifically, as will be described in greater detail below, the encoder 311 inverts each bit of the twelve bit binary code in the appropriate circumstances. The translations of Table 1 provide that inversions of the binary code produces a corresponding inversion in the ternary symbol. In practice, the binary codes utilize only one of the two binary expressions of the 0 ternary symbol. For the present embodiment, each group of two bits of a binary code can be either "00 ," "10," or "11."

TABLE 1

| Simple 2b-to-1t Translations | |
|---|---|
| Binary | Ternary |
| 00 | −1 |
| 10 | 0 |
| 01 | 0 |
| 11 | +1 |

Appendix A shows one mapping table of ternary codes for all possible combinations of eight bit binary data according to the present embodiment. In light of the translations of Table 1, Appendix A also inherently shows the binary codes. The 256 ternary codes are all either zero-balanced or +1 balanced ("positive balanced"). In other words, the sum of the ternary symbols for every ternary code is equal to either zero or positive one. Alternatively, −1 balanced ("negative balanced") ternary codes in which the sum of the six ternary symbols is equal to negative one may be used. As shown, the ternary codes for data bytes having a value between 0 to 244 are arranged in a sorted manner such that "even" bytes (bytes which have a logic 0 at the least significant bit position) are assigned zero-balanced codes and "odd" bytes (bytes which have a logic 1 at the least significant bit position) are assigned positive balanced codes. Those bytes having a value greater than 244 are assigned zero-balanced codes. Further, each ternary code contains at least two transitions and has no more than three leading or trailing 0 symbols. The ternary codes are self-clocking codes in which the timing is incorporated into the signal itself to obviate the need for a separate docking channel. The previous two features of the ternary codes are included to better ensure that no loss of synchronization occurs between nodes. For networks that do not use self-docking codes, these two features are not required.

To achieve a time-averaged zero DC balance for the serial link 105, the binary-to-ternary encoder 311 inverts positive balanced ternary codes as necessary to produce negative balanced codes. When a first positive balanced code is transmitted, the next positive balanced code to be transmitted is inverted to produce a negative balanced code. Any intervening zero-balanced codes are not inverted. In this manner, the number of ternary positive and negative 1's transmitted will be equal over time, resulting in a time-averaged zero DC balance for the serial link 105.

It should be noted that the encoding scheme may be implemented using alternative mapping tables. The ternary codes need not be limited to zero, +1, and −1 balanced codes. However, the mapping table of Appendix A is advantageous as it results in relatively simple circuit implementations. Further, the tri-level encoding scheme of binary data of the present embodiment may be adapted according to the specific protocols and system needs of a particular communication system. When applying a tri-level encoding scheme to systems that encode more than or less than eight binary bits of data at a time, such factors as speed of encoding, speed of decoding, speed of transmission and the time-averaged DC balance of the serial link must be balanced according to the needs of the particular system.

Figure 4:
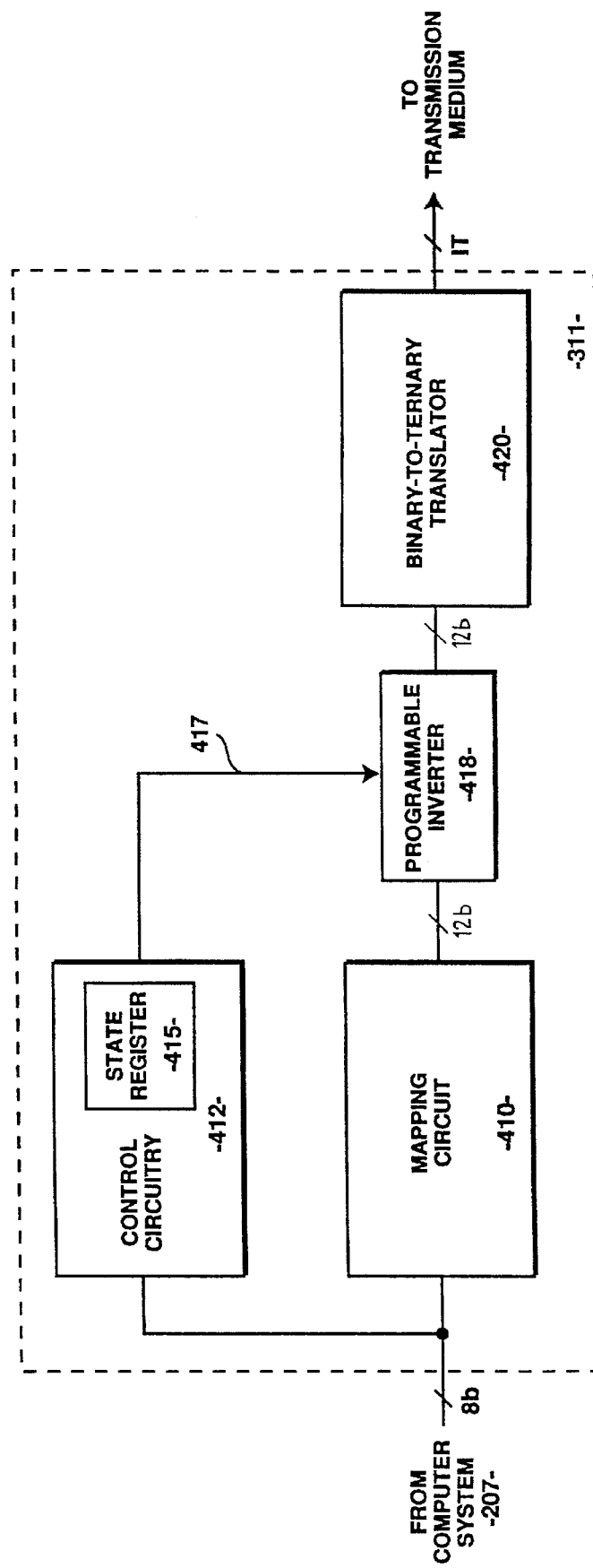
FIG. 4 shows an binary-to-ternary encoder.

FIG. 4 shows binary-to-ternary encoder 311 in greater detail. Binary-to-ternary encoder 311 includes mapping circuit 410, encode control circuitry 412, programmable inverters 418 and binary-to-ternary translator 420. Mapping circuit 410 maps an incoming binary byte into a corresponding twelve bit binary code according to the mapping table of Appendix A. Mapping circuit 410 is preferably comprised of combinational logic to reduce hardware costs. The specific combinational logic gates used may be selected by a designer using techniques that are well known in the art such that a given input byte of data yields a corresponding output binary code. Alternatively, mapping logic 410 may be comprised of a programmable logic array (PLA), programmable array logic (PAL), a programmable logic device (PLD), or a look-up table. A look-up table may be implemented using random access memory (RAM) or read only memory (ROM).

Encode control circuitry 412 is coupled to receive the incoming eight bits of data. The encode control circuitry 412 determines when a positive balanced code is to be mapped by the mapping circuit 410 by checking the value of the incoming byte of data. If the incoming byte is less than 245 and has a lowest significant bit of logic 1, the code is positive balanced. Of course, this checking scheme is dependent on the code table and binary-to-ternary translation implemented. A checking scheme that is independent of the implemented code table and translation scheme would require checking the balance of the ternary code after the translation from the binary code.

Encode control circuitry 412 determines whether to invert a positive balanced code by checking the state of a state register 415. The state register 415 is one binary bit wide and is initialized to a binary logic 0. The encode control circuitry 412 increments the state register 415 by one when a first positive balanced code is mapped. The next positive balanced code that is mapped is inverted, and the encode control circuitry 412 resets the state register 415 to zero.

Figure 11A:
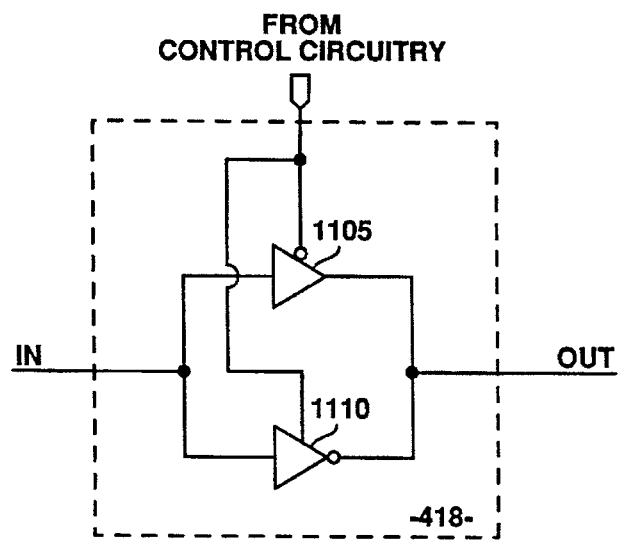
FIG. 11A shows a programmable inverter.
Figure 11B:
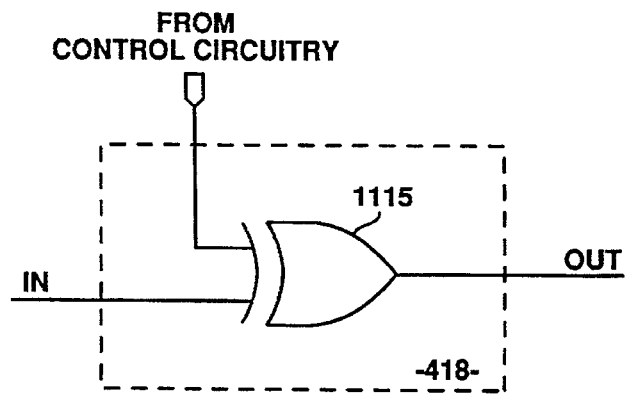
FIG. 11B shows a programmable inverter.
Figure 11C:
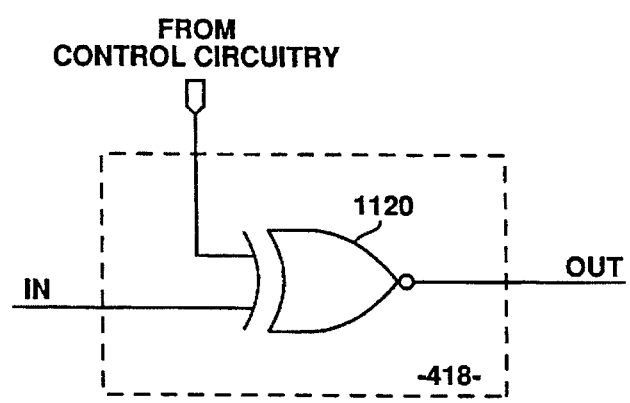
FIG. 11C shows a programmable inverter.

Encode control circuitry 412 provides output control signals via signal lines 417 to the programmable inverters 418 to enable and disable the programmable inverters 418. The programmable inverters 418 act as inverters when enabled and as non-inverting buffers when disabled. Each programmable inverter 418 may be implemented as a two-input exclusive OR (XOR) gates if a logic high control signal enables the programmable inverters 418 (i.e., the control signal is an active high signal). Each programmable inverter 418 may alternatively be implemented as a two-input exclusive NOR (XNOR) gate if a logic low control signal enables the programmable inverters 418 (i.e. the control signal is an active low signal). Further, each programmable inverter 418 may include a buffer and an inverter, each of which receives the control signal and only one of which is enabled at any one time. These possibilities are shown in FIGS. 11A, 11B, and 11C below. A programmable inverter 418 is provided for each output of the mapping circuit 410. For example, wherein the output of the mapping circuit 410 is twelve bits, there are twelve programmable inverters 418.

An alternative method for providing inverted binary codes requires that the mapping circuit contains two maps, a non-inverted map and an inverted map. The inverted map contains inverted binary codes that are mapped to the same binary data. The encode control circuitry 412 is coupled to the mapping circuit 410 for selecting the map to be used. The encode control circuitry 412 makes the selection according to the criteria detailed above.

Figure 5:
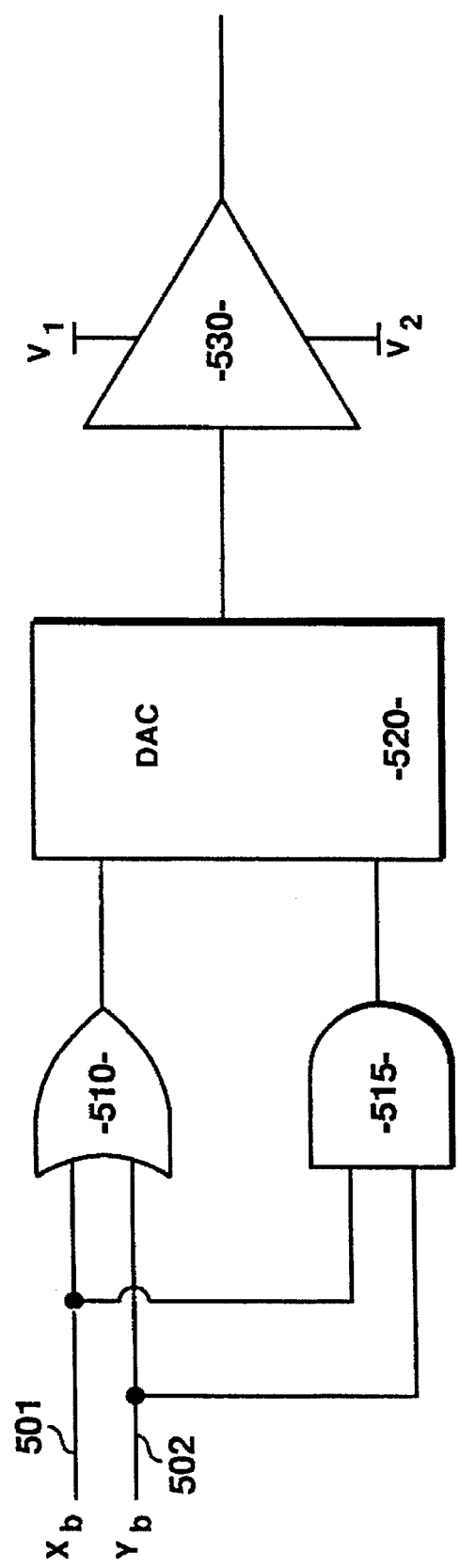
FIG. 5 shows a binary-to-ternary translator.

FIG. 5 shows a portion of a binary-to-ternary translator in greater detail. Binary-to-ternary translator 420 translates one of the two bit groups of the twelve bit binary code according to the translation table of Table 1. Binary-to-ternary translator 420 includes OR gate 510, AND gate 515, digital-to-analog converter (DAC) 520, and tri-level output buffer 530. Two bits of a binary code are received by the OR gate 510 via signal lines 501 and 502. OR gate 510 and AND gate 515 are configured such that a "10" is output if the two bits are not the same. Equivalent logic circuits may be employed. Signal line 501 carries the more significant bit, bit $x_b$, and signal line 502 carries the less significant bit, bit $Y_b$. The outputs of OR gate 510 and AND gate 515 are coupled as inputs to DAC 520. DAC 520 drives the tri-level output buffer 530 to output tri-level analog voltage levels. The V1 supply provides the positive side voltage, and the V2 supply provides the negative side voltage. The circuitry shown in FIG. 5 is preferably replicated for each two bit group of the twelve binary bit code. A single DAC having six outputs may be used. Also included, but not shown, is a parallel-to-serial converter for sequencing the six ternary symbols output by the DAC 520.

Figure 6:
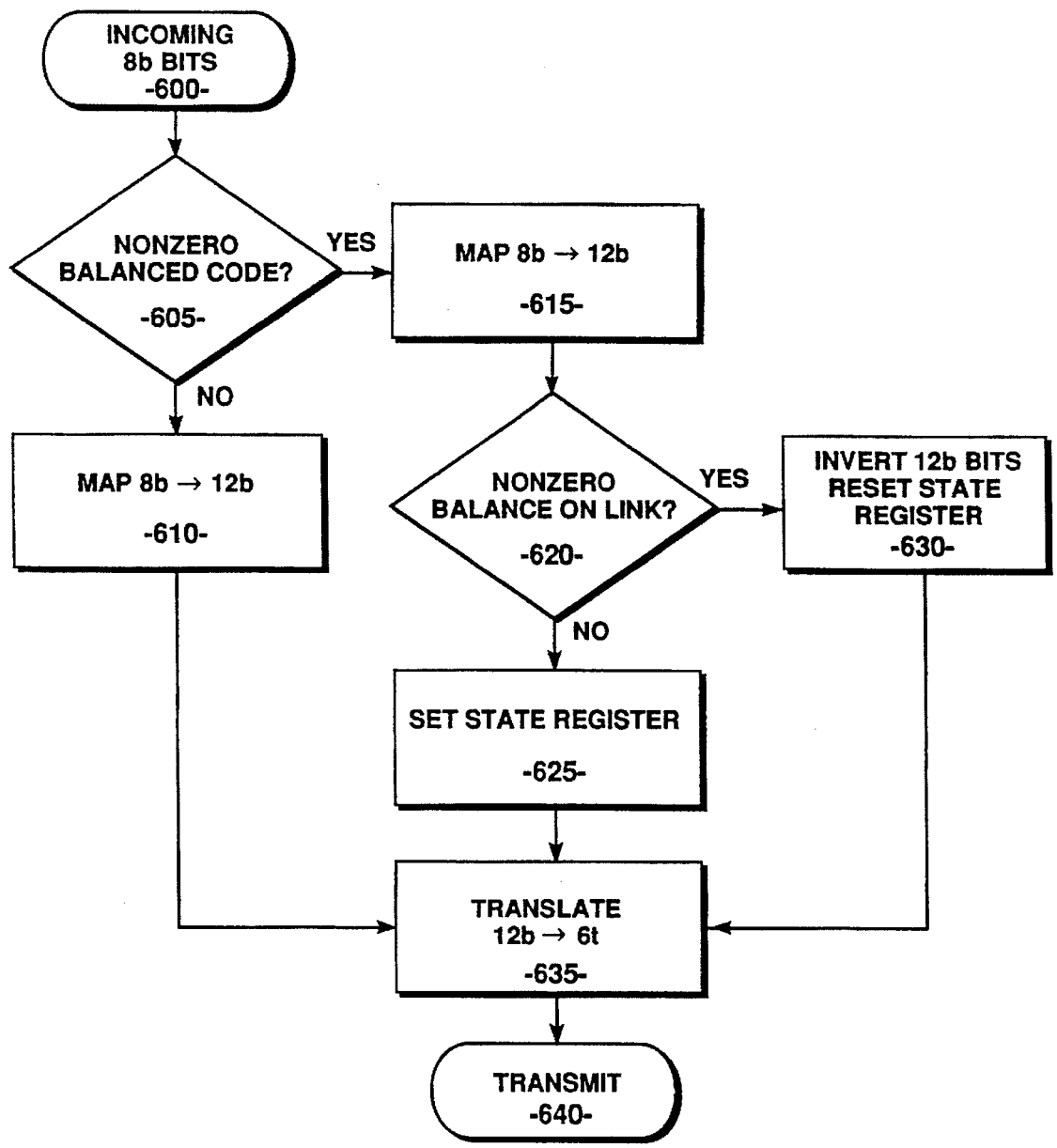
FIG. 6 is a flow chart showing an encoding method according to one embodiment.

FIG. 6 is a flow chart illustrating the method utilized by the binary-to-ternary encoder 311. At step 600, eight bits of binary data are provided by the computer system 207 to the binary-to-ternary encoder 311. At step 605, the binary-to-ternary encoder 311 determines if the binary code for the incoming eight bits of binary data is a nonzero balanced code. For one embodiment, this is done by checking the incoming eight bits rather than by checking the binary code. If the value of the incoming eight bits is less than 245 and the least significant bit is a logic 1, the binary code is not zero-balanced.

At step 610, if the binary code is zero balanced, the binary-to-ternary encoder 311 encodes the eight bits of binary data according to the above-described limitations. Similarly, the eight bits are mapped to the binary code at step 615 if the code is non zero balanced. The decisional step 605 may occur after mapping occurs in response to either the binary data or the binary code.

At step 620, the binary-to-ternary encoder 311 determines if there is a nonzero balance on the serial link by referring to a memory element such as state register 415. If the state register 415 is not set at step 620, the flow continues at step 625, where the state register is set to indicate that the serial link 105 is not zero-balanced. If the state register 415 was previously set, the flow proceeds to step 630, where the binary-to-ternary encoder 311 inverts the binary code and resets the state register 415. For this embodiment, the state register has only two possible states. In this manner, the time-averaged DC balance of the serial link 105 is a zero DC balance.

After the incoming byte of data is coded into the twelve binary bit code at steps 610, 625, or 630, the binary-to-ternary encoder 311 translates the binary code into an equivalently balanced ternary code. This may be done according to the truth table of Table 1 using the binary to ternary translator circuitry shown in FIG. 5. The ternary code is transmitted at step 640.

Figure 7:
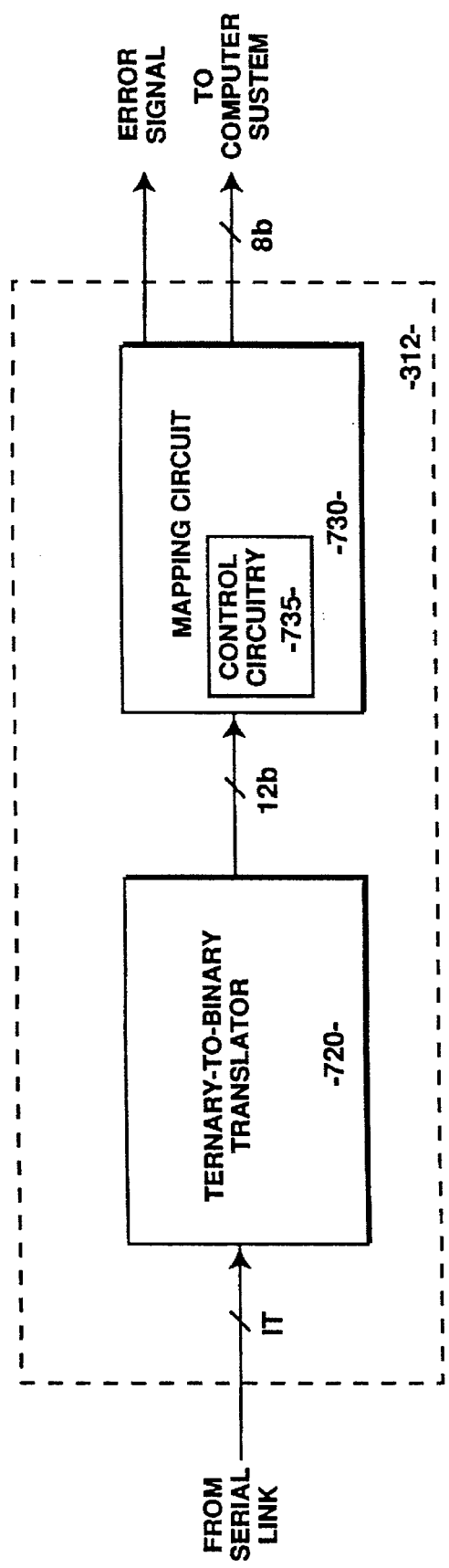
FIG. 7 shows a ternary-to-binary decoder.

FIG. 7 shows a ternary-to-binary decoder according to one embodiment. As shown, the ternary-to-binary decoder 312 includes ternary-to-binary translator 720 and decode mapping circuit 730, which includes decode control circuitry 735. The ternary-to-binary translator 720 receives six ternary symbols in a serial manner and translates them into a twelve bit binary code having a parallel format. The twelve bit binary code is then forwarded to the decode mapping circuit 730. Decode control circuitry 735 within the mapping logic 730 determines whether an error has occurred in transmission and whether the translated binary code must be inverted. If an error has occurred in transmission, the decode mapping circuit 730 signals an error to the computer system 207. If no error has occurred, the decode mapping circuit 730 maps the twelve bit binary code into the eight bit data and forwards it to the computer system 207.

Figure 8:
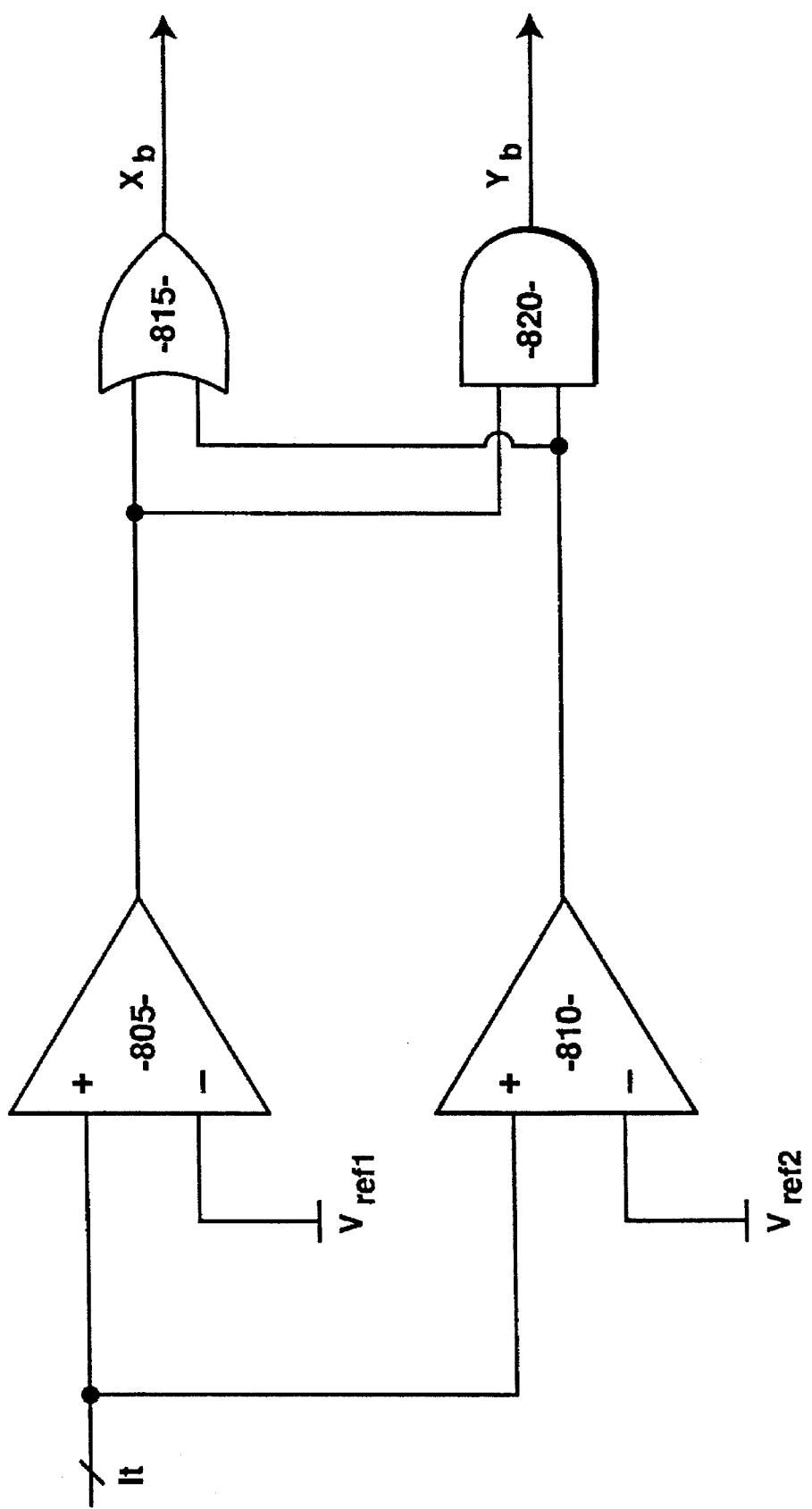
FIG. 8 shows a ternary-to-binary translator.

FIG. 8 shows the ternary-to-binary translator 720 in greater detail. The ternary-to-binary translator 720 includes two differential comparators 805 and 810. The ternary symbol received from the serial link 105 is coupled to the positive inputs of the differential comparators 805 and 810. The negative terminal of comparator 805 is coupled to a reference supply $V_{ref1}$, which preferably corresponds to a voltage between the voltages for ternary 0 and ternary −1. For example, where the analog voltage for a ternary −1 is equal to −3.5 volts, and the analog voltage for ternary symbol 0 is 0.0 volts, an appropriate voltage for $V_{ref1}$ is −1.0 volts. The comparator 810 preferably has its negative terminal coupled to a reference voltage supply $V_{ref2}$. When the analog voltage for a ternary symbol 1 is equal to 3.5 volts, $V_{ref2}$ is preferably equal to 1.0 volts.

The outputs of differential comparators 805 and 810 are both fed as inputs to OR gate 815 and AND gate 820. The OR gate 815 outputs the more significant bit of a two bit group, $x_b$. The AND gate 820 outputs the less significant bit of a two bit group, $Y_b$. The outputs of this portion of the ternary-to-binary translator may be fed serially to a first-in-first-out (FIFO) buffer that outputs twelve binary bits in parallel to achieve the desired serial to parallel conversion. The necessary control circuitry and the data buffer memory is preferably provided in the ternary-to-binary translator 720.

Figure 9:
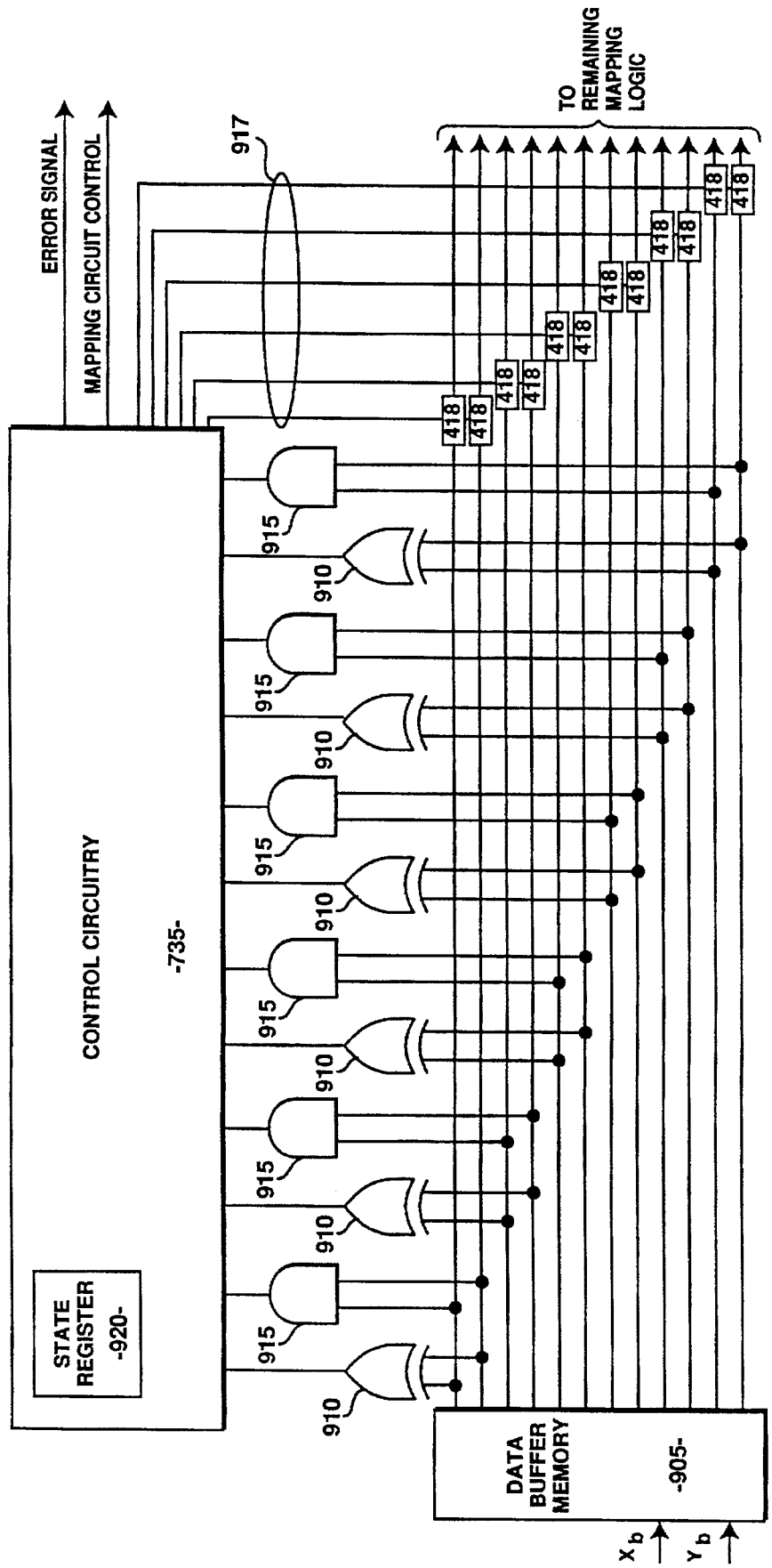
FIG. 9 shows a portion of the decoding mapping logic.

FIG. 9 shows a portion of the decode mapping circuit 730. The data buffer memory 905 is preferably that discussed in relationship to the ternary-to-binary translator of FIG. 8. As shown, two bits are received by data buffer memory 905 and 12 bits are output by data buffer memory 905. Associated with each contiguous pair of output lines of the data buffer memory 905 is an XOR gate 910 and an AND gate 915. Also coupled to each output line is a programmable inverter 925 which acts as described above. The programmable inverters 418 for each contiguous pair of output lines are controlled by a single control line from decode control circuitry 735. Thus, there are a total of six XOR gates 910, six AND gates 915, twelve programmable inverters 418, and six control lines 917.

The decode control circuitry 735 counts the total number of logic 1's and the total number of logic 0's received from the outputs of the AND gates 915. The decode control circuitry 735 compares the total number of logic 0's to the total number of logic 1's to determine if a transmission error has occurred. A transmission error has occurred if the balance of a received ternary code is incorrect in view of the known state of the serial link 105 and the encoding scheme. The decode control circuitry 735 only counts the outputs of an AND gate 915 if the corresponding XOR gate 910 of the contiguous pair of output lines outputs a logic 0, which signifies that the both bits of the contiguous pair of output lines are the same. As seen in Table 1, this corresponds to either ternary −1 or ternary +1. The binary bits corresponding to a ternary 0 symbol are not considered because they do not affect the balance of the ternary code. In this manner, the balance of the ternary code is determined.

If the total number of logic 0's is equal to the total number of logic 1's, the ternary code is zero-balanced and the decode control circuitry 735 signals the remainder of the mapping logic to map the twelve binary bits to the eight binary bit data. The programmable inverters 418 are disabled.

If the total number of logic 1's exceeds the total number of logic 0's by one, the decode control circuitry 735 checks the state register 920. If the state register 920 is set to a logic 0, the decode control circuitry 735 sets the state register to a logic one and signals the remainder of the mapping logic to map the binary code to binary data. If the state register is set to a logic one, an error is signaled by the decode control circuitry 735.

If the total number of logic 0's is greater than the total number of logic 1's by one, the decode control circuitry 735 checks the state register 920. If the state register is set to a logic 1, the decode control circuitry 735 resets the state register 920 to logic 0 and enables the programmable inverters 418 to cause the inversion of the outputs from the data buffer memory 905. The decode control circuitry 735 only enables those programmable inverters 418 associated with a contiguous pair of output lines in which both bits are the same. If the output of the XOR gate 915 for a contiguous pair of output lines is a logic 1, the associated programmable inverters are disabled. The decode control circuitry 735 outputs an error signal if the total number of logic 0's is greater than the number of logic 1's by one when the state register is set to logic 0.

The decode control circuitry 735 also signals an error if the total number of logic 0's exceeds the total number of logic 1's by more than one. Similarly an error signal is generated if the total number of logic 1's exceeds that total number of logic 0's by more than one.

Figure 10:
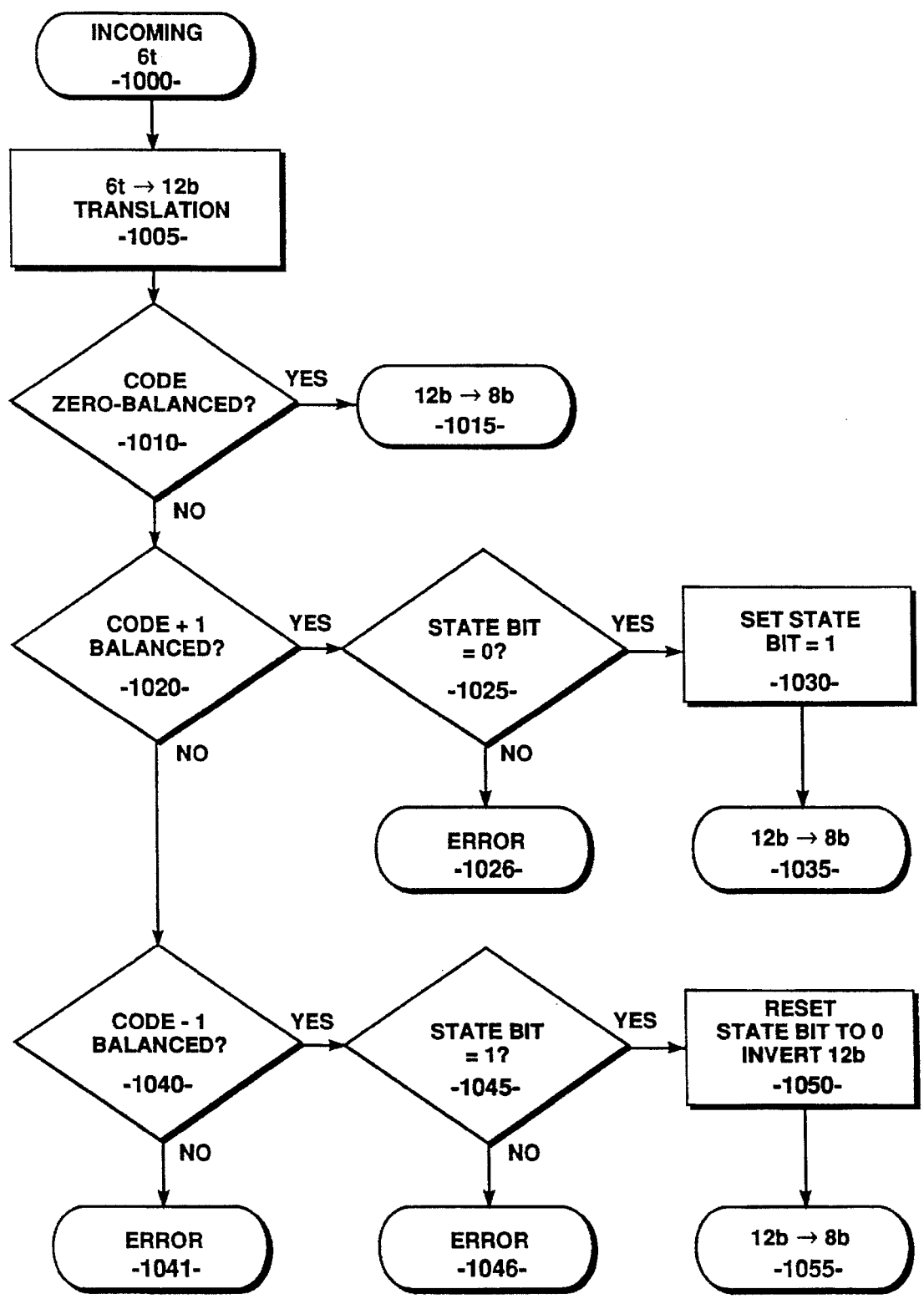
FIG. 10 shows a decoding method.

FIG. 10 shows the method of the ternary-to-binary decoder according to one embodiment. At step 1000, 6 ternary symbols are received by the ternary-to-binary decoder 312. At step 1005, the ternary-to-binary translation occurs such that the 6 ternary symbols are translated into a twelve bit binary code. At step 1010, it is determined whether the ternary code is zero balanced. If the ternary code is zero-balanced, the decode mapping circuit 730 translates the twelve bit binary code to the eight bit binary data at step 1015. If the ternary code is not zero-balanced, it is determined whether the ternary code is positive balanced at step 1020. If the ternary code is positive balanced, at step 1025 it is determined whether the state bit of the state register is equal to logic 0. If the state bit is not equal to logic 0, an error is signaled at step 1026. If the state bit is equal to zero, the state bit is set to be equal to one at step 1030. The binary code is mapped to binary data at step 1035.

If the ternary code is not positive balanced at step 1020, it is determined whether the ternary code is negative balanced at step 1040. If the ternary code is not negative balanced, an error is signaled at step 1041 because the balance is greater that ±1 balanced. If the ternary code is negative balanced, it is determined at step 1045 whether the state bit is equal to logic 1. If the state bit is not equal to logic 1, an error is signaled at step 1046. If the state bit is equal to logic 1, the state bit is reset to zero and the appropriate portions of the binary code are inverted at step 1050. The binary code is mapped to binary data at step 1055.

FIGS. 11A–11C show various alternative embodiments for the programmable inverters. FIG. 11A shows a programmable inverter 418 as a buffer 1105 and an inverter 1110, each of which is coupled to receive the same input and control signal. Both the buffer 1105 and the inverter 1110 are enabled by the control signal, but the enable input of the buffer 1105 is inverted such that only one of the buffer 1105 and the inverter 1110 is enabled at any one time. FIG. 11B shows a programmable inverter 418 as an XOR gate 1115 having one input coupled to receive the control signal and a second input coupled to receive an input. FIG. 11C shows a programmable inverter 418 as an XNOR gate 1120 having one input coupled to receive the control signal and a second input coupled to receive an input. The inputs for each of the various programmable inverters 418 may be received from the mapping logic 410 or the data buffer memory 905.

In the foregoing specification the invention has been described with reference to specific exemplary embodiments thereof. It will, however, be evident that various modifications and changes may be made thereto without departing from the broader spirit and scope of the invention as set forth in the appended claims.

APPENDIX A

| DC | DATA (HEX) | tbit0 | tbit1 | tbit2 | tbit3 | tbit4 | tbit5 |
|---|---|---|---|---|---|---|---|
| 0 | 00 | 0 | 0 | 0 | 1 | 0 | −1 |
| 1 | 01 | 0 | 0 | 0 | 1 | 0 | 0 |
| 0 | 02 | 0 | 0 | 0 | 1 | −1 | 0 |
| 1 | 03 | 0 | 0 | 0 | 1 | 1 | −1 |
| 0 | 04 | 0 | 0 | 0 | −1 | 0 | 1 |
| 1 | 05 | 0 | 0 | 0 | 1 | −1 | 1 |
| 0 | 06 | 0 | 0 | 0 | −1 | 1 | 0 |
| 1 | 07 | 0 | 0 | 0 | −1 | 1 | 1 |
| 0 | 08 | 0 | 0 | 1 | 0 | 0 | −1 |
| 1 | 09 | 0 | 0 | 1 | 0 | 0 | 0 |
| 0 | 0a | 0 | 0 | 1 | 0 | −1 | 0 |
| 1 | 0b | 0 | 0 | 1 | 0 | 1 | −1 |
| 0 | 0c | 0 | 0 | 1 | 1 | −1 | −1 |
| 1 | 0d | 0 | 0 | 1 | 0 | −1 | 1 |
| 0 | 0e | 0 | 0 | 1 | −1 | 0 | 0 |
| 1 | 0f | 0 | 0 | 1 | 1 | 0 | −1 |
| 0 | 10 | 0 | 0 | 1 | −1 | 1 | −1 |
| 1 | 11 | 0 | 0 | 1 | 1 | −1 | 0 |
| 0 | 12 | 0 | 0 | 1 | −1 | −1 | 1 |
| 1 | 13 | 0 | 0 | 1 | 1 | 0 | 1 |
| 0 | 14 | 0 | 0 | −1 | 0 | 0 | 1 |
| 1 | 15 | 0 | 0 | 1 | −1 | 1 | 0 |
| 0 | 16 | 0 | 0 | −1 | 0 | 1 | 0 |
| 1 | 17 | 0 | 0 | −1 | 0 | 1 | 1 |
| 0 | 18 | 0 | 0 | −1 | 1 | 0 | 0 |
| 1 | 19 | 0 | 0 | −1 | 1 | 0 | 1 |
| 0 | 1a | 0 | 0 | −1 | 1 | 1 | −1 |
| 1 | 1b | 0 | 0 | −1 | 1 | 1 | 0 |
| 0 | 1c | 0 | 0 | −1 | 1 | −1 | 1 |
| 1 | 1d | 0 | 1 | 0 | 0 | 1 | −1 |
| 0 | 1e | 0 | 0 | −1 | −1 | 1 | 1 |
| 1 | 1f | 0 | 1 | 0 | 0 | −1 | 1 |

APPENDIX A -continued

| DC | DATA (HEX) | tbit0 | tbit1 | tbit2 | tbit3 | tbit4 | tbit5 |
|---|---|---|---|---|---|---|---|
| 0 | 20 | 0 | 1 | 0 | 0 | 0 | −1 |
| 1 | 21 | 0 | 1 | 0 | 1 | 0 | −1 |
| 0 | 22 | 0 | 1 | 0 | 0 | −1 | 0 |
| 1 | 23 | 0 | 1 | 0 | 1 | −1 | 0 |
| 0 | 24 | 0 | 1 | 0 | 1 | −1 | −1 |
| 1 | 25 | 0 | 1 | 0 | −1 | 0 | 1 |
| 0 | 26 | 0 | 1 | 0 | −1 | 0 | 0 |
| 1 | 27 | 0 | 1 | 0 | −1 | 1 | 0 |
| 0 | 28 | 0 | 1 | 0 | −1 | 1 | −1 |
| 1 | 29 | 0 | 1 | 1 | 0 | 0 | −1 |
| 0 | 2a | 0 | 1 | 0 | −1 | −1 | 1 |
| 1 | 2b | 0 | 1 | 1 | 0 | −1 | 0 |
| 0 | 2c | 0 | 1 | 1 | 0 | −1 | −1 |
| 1 | 2d | 0 | 1 | 1 | 1 | −1 | −1 |
| 0 | 2e | 0 | 1 | 1 | −1 | 0 | −1 |
| 1 | 2f | 0 | 1 | 1 | −1 | 0 | 0 |
| 0 | 30 | 0 | 1 | 1 | −1 | −1 | 0 |
| 1 | 31 | 0 | 1 | 1 | −1 | 1 | −1 |
| 0 | 32 | 0 | 1 | −1 | 0 | 0 | 0 |
| 1 | 33 | 0 | 1 | 1 | −1 | −1 | 1 |
| 0 | 34 | 0 | 1 | −1 | 0 | 1 | −1 |
| 1 | 35 | 0 | 1 | −1 | 0 | 0 | 1 |
| 0 | 36 | 0 | 1 | −1 | 0 | −1 | 1 |
| 1 | 37 | 0 | 1 | −1 | 0 | 1 | 0 |
| 0 | 38 | 0 | 1 | −1 | 1 | 0 | −1 |
| 1 | 39 | 0 | 1 | −1 | 1 | 0 | 0 |
| 0 | 3a | 0 | 1 | −1 | 1 | −1 | 0 |
| 1 | 3b | 0 | 1 | −1 | 1 | 1 | −1 |
| 0 | 3c | 0 | 1 | −1 | −1 | 0 | 1 |
| 1 | 3d | 0 | 1 | −1 | 1 | −1 | 1 |
| 0 | 3e | 0 | 1 | −1 | −1 | 1 | 0 |
| 1 | 3f | 0 | 1 | −1 | −1 | 1 | 1 |
| 0 | 40 | 0 | −1 | 0 | 0 | 0 | 1 |
| 1 | 41 | 0 | −1 | 0 | 0 | 1 | 1 |
| 0 | 42 | 0 | −1 | 0 | 0 | 1 | 0 |
| 1 | 43 | 0 | −1 | 0 | 1 | 0 | 1 |
| 0 | 44 | 0 | −1 | 0 | 1 | 0 | 0 |
| 1 | 45 | 0 | −1 | 0 | 1 | 1 | 0 |
| 0 | 46 | 0 | −1 | 0 | 1 | 1 | −1 |
| 1 | 47 | 0 | −1 | 1 | 0 | 0 | 1 |
| 0 | 48 | 0 | −1 | 0 | 1 | −1 | 1 |
| 1 | 49 | 0 | −1 | 1 | 0 | 1 | 0 |
| 0 | 4a | 0 | −1 | 0 | −1 | 1 | 1 |
| 1 | 4b | 0 | −1 | 1 | 1 | 0 | 0 |
| 0 | 4c | 0 | −1 | 1 | 0 | 0 | 1 |
| 1 | 4d | 0 | −1 | 1 | 1 | 1 | −1 |
| 0 | 4e | 0 | −1 | 1 | 0 | 1 | −1 |
| 1 | 4f | 0 | −1 | 1 | 1 | −1 | 1 |
| 0 | 50 | 0 | −1 | 1 | 0 | −1 | 1 |
| 1 | 51 | 0 | −1 | 1 | −1 | 1 | 1 |
| 0 | 52 | 0 | −1 | 1 | 1 | 0 | −1 |
| 1 | 53 | 0 | −1 | −1 | 1 | 1 | 1 |
| 0 | 54 | 0 | −1 | 1 | 1 | −1 | 0 |
| 1 | 55 | 1 | 0 | 0 | 0 | 1 | −1 |
| 0 | 56 | 0 | −1 | 1 | −1 | 0 | 1 |
| 1 | 57 | 1 | 0 | 0 | 0 | −1 | 1 |
| 0 | 58 | 0 | −1 | 1 | −1 | 1 | 0 |
| 1 | 59 | 1 | 0 | 0 | 1 | 0 | −1 |
| 0 | 5a | 0 | −1 | −1 | 0 | 1 | 1 |
| 1 | 5b | 1 | 0 | 0 | 1 | −1 | 0 |
| 0 | 5c | 0 | −1 | −1 | 1 | 0 | 1 |
| 1 | 5d | 1 | 0 | 0 | −1 | 0 | 1 |
| 0 | 5e | 0 | −1 | −1 | 1 | 1 | 0 |
| 1 | 5f | 1 | 0 | 0 | −1 | 1 | 0 |
| 0 | 60 | 1 | 0 | 0 | 0 | 0 | −1 |
| 1 | 61 | 1 | 0 | 0 | 1 | 0 | −1 |
| 0 | 62 | 1 | 0 | 0 | 0 | −1 | 0 |
| 1 | 63 | 1 | 0 | 1 | 0 | −1 | 0 |
| 0 | 64 | 1 | 0 | 0 | 0 | 1 | −1 |
| 1 | 65 | 1 | 0 | 1 | 1 | −1 | −1 |
| 0 | 66 | 1 | 0 | 0 | −1 | 0 | 0 |
| 1 | 67 | 1 | 0 | 1 | −1 | 0 | 0 |
| 0 | 68 | 1 | 0 | 0 | −1 | 1 | −1 |
| 1 | 69 | 1 | 0 | 1 | −1 | 1 | −1 |
| 0 | 6a | 1 | 0 | 0 | −1 | −1 | 1 |

APPENDIX A

| DC | DATA (HEX) | tbit0 | tbit1 | tbit2 | tbit3 | tbit4 | tbit5 |
|---|---|---|---|---|---|---|---|
| 1 | 6b | 1 | 0 | 1 | -1 | -1 | 1 |
| 0 | 6c | 1 | 0 | 1 | 0 | -1 | -1 |
| 1 | 6d | 1 | 0 | -1 | 0 | 0 | 1 |
| 0 | 6e | 1 | 0 | 1 | -1 | 0 | -1 |
| 1 | 6f | 1 | 0 | -1 | 0 | 1 | 0 |
| 0 | 70 | 1 | 0 | 1 | -1 | -1 | 0 |
| 1 | 71 | 1 | 0 | -1 | 1 | 0 | 0 |
| 0 | 72 | 1 | 0 | -1 | 0 | 0 | 0 |
| 1 | 73 | 1 | 0 | -1 | 1 | 1 | -1 |
| 0 | 74 | 1 | 0 | -1 | 0 | 1 | -1 |
| 1 | 75 | 1 | 0 | -1 | 1 | -1 | 1 |
| 0 | 76 | 1 | 0 | -1 | 0 | -1 | 1 |
| 1 | 77 | 1 | 0 | -1 | -1 | 1 | 1 |
| 0 | 78 | 1 | 0 | -1 | 1 | 0 | -1 |
| 1 | 79 | 1 | 1 | 0 | 0 | 0 | -1 |
| 0 | 7a | 1 | 0 | -1 | 1 | -1 | 0 |
| 1 | 7b | 1 | 1 | 0 | 0 | -1 | 0 |
| 0 | 7c | 1 | 0 | -1 | -1 | 0 | 1 |
| 1 | 7d | 1 | 1 | 0 | 1 | -1 | -1 |
| 0 | 7e | 1 | 0 | -1 | -1 | 1 | 0 |
| 1 | 7f | 1 | 1 | 0 | -1 | 0 | 0 |
| 0 | 80 | 1 | 1 | 0 | 0 | -1 | -1 |
| 1 | 81 | 1 | 1 | 0 | -1 | 1 | -1 |
| 0 | 82 | 1 | 1 | 0 | -1 | 0 | -1 |
| 1 | 83 | 1 | 1 | 0 | -1 | -1 | 1 |
| 0 | 84 | 1 | 1 | 0 | -1 | -1 | 0 |
| 1 | 85 | 1 | 1 | 1 | 0 | -1 | -1 |
| 0 | 86 | 1 | 1 | -1 | 0 | 0 | -1 |
| 1 | 87 | 1 | 1 | 1 | -1 | 0 | -1 |
| 0 | 88 | 1 | 1 | -1 | 0 | -1 | 0 |
| 1 | 89 | 1 | 1 | 1 | -1 | -1 | 0 |
| 0 | 8a | 1 | 1 | -1 | 1 | -1 | -1 |
| 1 | 8b | 1 | 1 | -1 | 0 | 0 | 0 |
| 0 | 8c | 1 | 1 | -1 | -1 | 0 | 0 |
| 1 | 8d | 1 | 1 | -1 | 0 | 1 | -1 |
| 0 | 8e | 1 | 1 | -1 | -1 | 1 | -1 |
| 1 | 8f | 1 | 1 | -1 | 0 | -1 | 1 |
| 0 | 90 | 1 | 1 | -1 | -1 | -1 | 1 |
| 1 | 91 | 1 | 1 | -1 | 1 | 0 | -1 |
| 0 | 92 | 1 | -1 | 0 | 0 | 1 | -1 |
| 1 | 93 | 1 | 1 | -1 | 1 | -1 | 0 |
| 0 | 94 | 1 | -1 | 0 | 0 | -1 | 1 |
| 1 | 95 | 1 | 1 | -1 | -1 | 0 | 1 |
| 0 | 96 | 1 | -1 | 0 | 1 | 0 | -1 |
| 1 | 97 | 1 | 1 | -1 | -1 | 1 | 0 |
| 0 | 98 | 1 | -1 | 0 | 1 | -1 | 0 |
| 1 | 99 | 1 | -1 | 0 | 0 | 0 | 1 |
| 0 | 9a | 1 | -1 | 0 | -1 | 0 | 1 |
| 1 | 9b | 1 | -1 | 0 | 0 | 1 | 0 |
| 0 | 9c | 1 | -1 | 0 | -1 | 1 | 0 |
| 1 | 9d | 1 | -1 | 0 | 1 | 0 | 0 |
| 0 | 9e | 1 | -1 | 1 | 0 | 0 | -1 |
| 1 | 9f | 1 | -1 | 0 | 1 | 1 | -1 |
| 0 | a0 | 1 | -1 | 1 | 0 | -1 | 0 |
| 1 | a1 | 1 | -1 | 0 | 1 | -1 | 1 |
| 0 | a2 | 1 | -1 | 1 | 1 | -1 | -1 |
| 1 | a3 | 1 | -1 | 0 | -1 | 1 | 1 |
| 0 | a4 | 1 | -1 | 1 | -1 | 0 | 0 |
| 1 | a5 | 1 | -1 | 1 | 0 | 0 | 0 |
| 0 | a6 | 1 | -1 | 1 | -1 | 1 | -1 |
| 1 | a7 | 1 | -1 | 1 | 0 | 1 | -1 |
| 0 | a8 | 1 | -1 | 1 | -1 | -1 | 1 |
| 1 | a9 | 1 | -1 | 1 | 0 | -1 | 1 |
| 0 | aa | 1 | -1 | -1 | 0 | 0 | 1 |
| 1 | ab | 1 | -1 | 1 | 1 | 0 | -1 |
| 0 | ac | 1 | -1 | -1 | 0 | 1 | 0 |
| 1 | ad | 1 | -1 | 1 | 1 | -1 | 0 |
| 0 | ae | 1 | -1 | -1 | 1 | 0 | 0 |
| 1 | af | 1 | -1 | 1 | -1 | 0 | 1 |
| 0 | b0 | 1 | -1 | -1 | 1 | 1 | -1 |
| 1 | b1 | 1 | -1 | 1 | -1 | 1 | 0 |
| 0 | b2 | 1 | -1 | -1 | 1 | -1 | 1 |
| 1 | b3 | 1 | -1 | -1 | 0 | 1 | 1 |
| 0 | b4 | 1 | -1 | -1 | -1 | 1 | 1 |
| 1 | b5 | 1 | -1 | -1 | 1 | 0 | 1 |

APPENDIX A

| DC | DATA (HEX) | tbit0 | tbit1 | tbit2 | tbit3 | tbit4 | tbit5 |
|---|---|---|---|---|---|---|---|
| 0 | b6 | -1 | 0 | 0 | 0 | 0 | 1 |
| 1 | b7 | 1 | -1 | -1 | 1 | 1 | 0 |
| 0 | b8 | -1 | 0 | 0 | 0 | 1 | 0 |
| 1 | b9 | -1 | 0 | 0 | 0 | 1 | 1 |
| 0 | ba | -1 | 0 | 0 | 1 | 0 | 0 |
| 1 | bb | -1 | 0 | 0 | 1 | 0 | 1 |
| 0 | bc | -1 | 0 | 0 | 1 | 1 | -1 |
| 1 | bd | -1 | 0 | 0 | 1 | 1 | 0 |
| 0 | be | -1 | 0 | 0 | 1 | -1 | 1 |
| 1 | bf | -1 | 0 | 1 | 0 | 0 | 1 |
| 0 | c0 | -1 | 0 | 0 | -1 | 1 | 1 |
| 1 | c1 | -1 | 0 | 1 | 0 | 1 | 0 |
| 0 | c2 | -1 | 0 | 1 | 0 | 0 | 0 |
| 1 | c3 | -1 | 0 | 1 | 1 | 0 | 0 |
| 0 | c4 | -1 | 0 | 1 | 0 | 1 | -1 |
| 1 | c5 | -1 | 0 | 1 | 1 | 1 | -1 |
| 0 | c6 | -1 | 0 | 1 | 0 | -1 | 1 |
| 1 | c7 | -1 | 0 | 1 | 1 | -1 | 1 |
| 0 | c8 | -1 | 0 | 1 | 1 | 0 | -1 |
| 1 | c9 | -1 | 0 | 1 | -1 | 1 | 1 |
| 0 | ca | -1 | 0 | 1 | 1 | -1 | 0 |
| 1 | cb | -1 | 0 | -1 | 1 | 1 | 1 |
| 0 | cc | -1 | 0 | 1 | -1 | 0 | 1 |
| 1 | cd | -1 | 1 | 0 | 0 | 0 | 1 |
| 0 | ce | -1 | 0 | 1 | -1 | 1 | 0 |
| 1 | cf | -1 | 1 | 0 | 0 | 1 | 0 |
| 0 | d0 | -1 | 0 | -1 | 0 | 1 | 1 |
| 1 | d1 | -1 | 1 | 0 | 1 | 0 | 0 |
| 0 | d2 | -1 | 0 | -1 | 1 | 0 | 1 |
| 1 | d3 | -1 | 1 | 0 | 1 | 1 | -1 |
| 0 | d4 | -1 | 0 | -1 | 1 | 1 | 0 |
| 1 | d5 | -1 | 1 | 0 | 1 | -1 | 1 |
| 0 | d6 | -1 | 1 | 0 | 0 | 1 | -1 |
| 1 | d7 | -1 | 1 | 0 | -1 | 1 | 1 |
| 0 | d8 | -1 | 1 | 0 | 0 | -1 | 1 |
| 1 | d9 | -1 | 1 | 1 | 0 | 0 | 0 |
| 0 | da | -1 | 1 | 0 | 1 | 0 | -1 |
| 1 | db | -1 | 1 | 1 | 0 | 1 | -1 |
| 0 | dc | -1 | 1 | 0 | 1 | -1 | 0 |
| 1 | dd | -1 | 1 | 1 | 0 | -1 | 1 |
| 0 | de | -1 | 1 | 0 | -1 | 0 | 1 |
| 1 | df | -1 | 1 | 1 | 1 | 0 | -1 |
| 0 | e0 | -1 | 1 | 0 | -1 | 1 | 0 |
| 1 | e1 | -1 | 1 | 1 | 1 | -1 | 0 |
| 0 | e2 | -1 | 1 | 1 | 0 | 0 | -1 |
| 1 | e3 | -1 | 1 | 1 | -1 | 0 | 1 |
| 0 | e4 | -1 | 1 | 1 | 0 | -1 | 0 |
| 1 | e5 | -1 | 1 | 1 | -1 | 1 | 0 |
| 0 | e6 | -1 | 1 | 1 | 1 | -1 | -1 |
| 1 | e7 | -1 | 1 | -1 | 0 | 1 | 1 |
| 0 | e8 | -1 | 1 | 1 | -1 | 0 | 0 |
| 1 | e9 | -1 | 1 | -1 | 1 | 0 | 1 |
| 0 | ea | -1 | 1 | 1 | -1 | 1 | -1 |
| 1 | eb | -1 | 1 | -1 | 1 | 1 | 0 |
| 0 | ec | -1 | 1 | 1 | -1 | -1 | 1 |
| 1 | ed | -1 | -1 | 0 | 1 | 1 | 1 |
| 0 | ee | -1 | 1 | -1 | 0 | 0 | 1 |
| 1 | ef | -1 | -1 | 1 | 0 | 1 | 1 |
| 0 | f0 | -1 | 1 | -1 | 0 | 1 | 0 |
| 1 | f1 | -1 | -1 | 1 | 1 | 0 | 1 |
| 0 | f2 | -1 | 1 | -1 | 1 | 0 | 0 |
| 1 | f3 | -1 | -1 | 1 | 1 | 1 | 0 |
| 0 | f4 | -1 | 1 | -1 | 1 | 1 | -1 |
| 0 | f5 | -1 | 1 | -1 | 1 | -1 | 1 |
| 0 | f6 | -1 | 1 | -1 | -1 | 1 | 1 |
| 0 | f7 | -1 | -1 | 0 | 0 | 1 | 1 |
| 0 | f8 | -1 | -1 | 0 | 1 | 0 | 1 |
| 0 | f9 | -1 | -1 | 0 | 1 | 1 | 0 |
| 0 | fa | -1 | -1 | 1 | 0 | 0 | 1 |
| 0 | fb | -1 | -1 | 1 | 0 | 1 | 0 |
| 0 | fc | -1 | -1 | 1 | 1 | 0 | 0 |
| 0 | fd | -1 | -1 | 1 | 1 | 1 | -1 |
| 0 | fe | -1 | -1 | 1 | 1 | -1 | 1 |
| 0 | ff | -1 | -1 | 1 | -1 | 1 | 1 |

What is claimed is:

1. A method for encoding binary data for transmission as ternary data over a serial link, the method comprising the steps of:

receiving binary data;

mapping the binary data into a binary code;

determining whether the ternary code is positive balanced;

determining whether the serial link has a positive direct current (DC) balance, by checking a state register, wherein the state register indicates that the serial link has the positive DC balance when the state register is in a first state, if the ternary code is positive balanced;

inverting the binary code if the serial link has the positive DC balance and the ternary code is positive balanced; and translating the binary code into the ternary code.

2. The method of claim 1, wherein the step of determining whether the ternary code is positive balanced comprises the step of:

checking a value of the binary data, wherein the binary code for the binary data is positive balanced if the value of the binary data is less than a predetermined value and the least significant bit is in a predetermined state.

3. The method of claim 2, wherein the predetermined value is 245 and the predetermined state is logic high.

4. The method of claim 1, wherein the first state is logic high.

5. The method of claim 1, wherein the step of inverting the ternary code comprises the step of inverting the binary code before the binary code is translated into the ternary code.

6. The method of claim 1, wherein the binary data comprises eight bits.

7. The method of claim 6, wherein the binary code comprises twelve bits.

8. The method of claim 7, wherein the ternary code comprises six ternary symbols.

9. The method of claim 8, wherein the step of translating the binary code into a ternary code comprises the steps of translating each two bit group of the binary code into a single ternary symbol.

10. A method for encoding binary data for transmission as ternary data over a serial link, the method comprising the steps of:

receiving binary data;

mapping the binary data into a binary code;

determining whether a ternary code is negative balanced;

determining whether the serial link has a negative direct current (DC) balance, by checking a state register, wherein the state register indicates that the serial link has the negative DC balance when the state register is in a first state, if the ternary code is negative balanced;

inverting the binary code if the serial link has the negative DC balance and the ternary code is negative balanced; and translating the binary code into the ternary code.

11. The method of claim 10, wherein the first state is logic high.

12. A method for decoding a ternary code received from a serial link into binary data, the method comprising the steps of:

receiving the ternary code;

translating the ternary code into a binary code;

determining whether the ternary code is zero balanced;

mapping the binary code into binary data if the ternary code is zero balanced;

determining whether the ternary code is positive balanced;

determining whether the serial link has a zero DC balance by checking a state register, a first state of the state register indicating the zero DC balance for the serial link, if the ternary code is positive balanced;

mapping the binary code into binary data if the ternary code is positive balanced and the serial link has the zero DC balance;

determining whether the ternary code is negative balanced;

determining whether the serial link has a positive DC balance if the ternary code is negative balanced;

inverting the binary code if the serial link has the positive DC balance and the ternary code is negative balanced; and, mapping the binary code into binary data after inverting the binary code if the serial link does has a positive DC balance and the ternary code is negative balanced.

13. The method of claim 12, the method further comprising the step of signaling an error if the ternary code is positive balanced and the serial link has the positive DC balance.

14. The method of claim 13, the method further comprising the step of signaling an error if the ternary code is negative balanced and the serial link has the zero DC balance.

15. The method of claim 14, wherein the positive balanced is positive one balanced, and negative balanced is negative one balanced.

16. The method of claim 15, the method further comprising the step of signaling the error if the ternary code is not zero balanced, positive one balanced, or negative one balanced.

17. The method of claim 12, wherein the first state of the state register is a logic low.

18. A binary-to-ternary encoder for encoding binary data for transmission of as a ternary code over a serial link, the binary-to-ternary encoder comprising:

a mapping circuit coupled to receive the binary data, the mapping circuit for mapping the binary data to a binary code;

a plurality of programmable inverters coupled to the mapping circuit for selectively inverting the binary code in response to an active control signal;

encode control circuitry coupled to receive the binary data, the encode control circuitry including a state register for maintaining a state of the serial link, wherein the encode control circuitry enables the plurality of programmable inverters to invert positive balanced binary codes when the state register indicates that a positive binary code has been transmitted, the encode control circuitry for providing the active control signal if the binary code is positive balanced and the serial link has a positive direct current (DC) balance; and a binary-to-ternary translator coupled to receive the binary code, the binary-to-ternary translator for translating the binary code into the ternary codes.

19. The binary-to-ternary data encoder of claim 18, wherein the plurality of programmable inverters act do not invert the binary code when the control signal is inactive.

20. The binary-to-ternary encoder of claim 18, wherein the control signal is active high and each of the plurality of programmable inverters is an XOR gate having the control signal as one input.

21. The binary-to-ternary encoder of claim 18, wherein the control signal is active low and each of the plurality of programmable inverters is an XNOR gate having the control signal as one input.

22. The binary-to-ternary encoder of claim 18, wherein each of the plurality of programmable inverters includes a buffer and driver, the buffer and the driver being coupled to receive the control signal such that only one of the buffer and the driver is enabled to output a portion of the binary code.

23. The binary-to-ternary encoder of claim 18, wherein the mapping circuit comprises combinational logic.

24. The binary-to-ternary encoder of claim 18, wherein mapping circuit comprises a look-up table.

25. The binary-to-ternary encoder of claim 18, wherein the binary-to-ternary translator comprises:

an OR gate coupled to receive a first bit of a binary code and a second bit of the binary code;

an AND gate coupled to receive the first bit and the second bit;

a digital to analog converter (DAC) coupled to receive outputs of the OR and AND gates;

a level shifter coupled to receive an output of the DAC, the level shifter for generating ternary voltage levels in response to the output of the DAC.

26. A ternary-to-binary decoder for decoding ternary data received from a serial link into binary data, the ternary-to-binary decoder comprising:

a ternary-to-binary translator coupled to the serial link, the ternary-to-binary translator for translating a ternary code into a binary code;

a mapping circuit coupled to the ternary-to-binary translator, the mapping circuit for mapping the binary code into binary data; and decode control circuitry coupled to the ternary-to-binary translator, the decode control circuitry including a state register for indicating a state of the serial link, the state register being set to a first state if a previously received binary code was positive balanced, the decode control circuitry providing the active control signal if the binary code is positive balanced and the state register is in the first state, the decode control circuitry for providing the active control signal if the binary code is positive balanced and a previously received binary code was positive balanced.

27. The ternary-to-binary decoder of claim 26, wherein the ternary-to-binary decoder further comprises a plurality of programmable inverters coupled between the ternary-to-binary translator and the mapping circuit, the plurality of programmable inverters for inverting the binary code in response to an active control signal.

28. A computer network comprising:

a serial link for transmitting ternary data;

a first node coupled to the serial link, the first node including a first circuit that operates using binary data and a binary-to-ternary encoder for encoding binary data received from the first circuit for transmission of a ternary code over the serial link, wherein the binary-to-ternary data encoder comprises:

a mapping circuit coupled to receive the binary data, the mapping circuit for mapping the binary data to a binary code;

a plurality of programmable inverters coupled to the mapping circuit for selectively inverting the binary code in response to an active control signal;

encode control circuitry coupled to receive the binary data, the encode control circuitry including a state register for maintaining a state of the serial link, wherein the encode control circuitry enables the plurality of programmable inverters to invert positive balanced binary codes when the state register indicates that a positive binary code has been transmitted, the encode control circuitry for providing the active control signal if the binary code is positive balanced and the serial link has a positive direct current (DC) balance; and a binary-to-ternary translator coupled to receive the binary code, the binary-to-ternary translator for translating the binary code into the ternary code;

a second node coupled to the serial link, the second node including a second circuit that operates using the binary data and a ternary-to-binary decoder for decoding ternary codes received from the serial link into binary data for the second circuit.

29. The computer network of claim 28, wherein the plurality of programmable inverters do not invert the binary code when the control signal is inactive.

30. The computer network of claim 28, wherein each of the plurality of programmable inverters includes a buffer and an inverter, the buffer and the inverter being coupled such that only one of the buffer and the inverter is enabled to output a portion of the binary code.

31. The computer network of claim 28, wherein the control signal is active high and each of the plurality of programmable inverters is an XOR gate having the control signal as one input.

32. The computer network of claim 28, wherein the control signal is active low and each of the plurality of programmable inverters is an XNOR gate having the control signal as one input.

33. The computer network of claim 28, wherein the mapping circuit comprises combinational logic.

34. The computer network of claim 28, wherein mapping circuit comprises a look-up table.

35. The computer network of claim 28, wherein the binary-to-ternary translator comprises:

an OR gate coupled to receive a first bit of a binary code and a second bit of the binary code;

an AND gate coupled to receive the first bit and the second bit;

a digital to analog converter (DAC) coupled to receive outputs of the OR and AND gates;

a level shifter coupled to receive an output of the DAC, the level shifter for generating ternary voltage levels in response to the output of the DAC.

36. The computer network of claim 28, wherein the ternary-to-binary decoder comprises:

a ternary-to-binary translator coupled to the serial link, the ternary-to-binary translator for translating the ternary code into the binary code;

a second mapping circuit coupled to the ternary-to-binary translator, the second mapping circuit for mapping the binary code into binary data.

37. The ternary-to-binary decoder of claim 36, wherein the ternary-to-binary decoder further comprises:

a second plurality of programmable inverters coupled between the ternary-to-binary translator and the second mapping circuit, the second plurality of programmable inverters for inverting the binary code in response to an active control signal;

decode control circuitry coupled to the ternary-to-binary translator and the second plurality of programmable inverters, the decode control circuitry for providing the active control signal if the binary code is positive balanced and a previously received binary code was positive balanced.

38. The ternary-to-binary decoder of claim 37, wherein the decode control circuitry includes a second state register for indicating a state of the serial link, the second state register being set to a first state if a previously received binary code was positive balanced, the decode control circuitry providing the active control signal if the binary code is positive balanced and the state register is in the first state.

* * * * *

UNITED STATES PATENT AND TRADEMARK OFFICE
CERTIFICATE OF CORRECTION

PATENT NO.   :   5,633,631
DATED        :   May 27, 1997
INVENTOR(S)  :   Timothy A. Teckman It is certified that error appears in the above-identified patent and that said Letters Patent is hereby corrected as shown below:

In column 3 at line 66 delete "flames" and insert --frames--

In column 4 at line 58 delete "docking" and insert --clocking--

In column 4 at line 61 delete "self-docking" and insert --self-clocking--

Signed and Sealed this

Fourth Day of November, 1997

*Attest:*

BRUCE LEHMAN

*Attesting Officer*   *Commissioner of Patents and Trademarks*